(12) United States Patent
Choi et al.

(10) Patent No.: US 11,127,607 B2
(45) Date of Patent: Sep. 21, 2021

(54) HEAT PROCESSING SYSTEM

(71) Applicant: XIA TAI XIN SEMICONDUCTOR (QING DAO) LTD., Qingdao (CN)

(72) Inventors: Chiku Choi, Singapore (SG);
Eun-Joung Lee, Singapore (SG);
Sung-Ki Kim, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 0 days.

(21) Appl. No.: 16/680,446

(22) Filed: Nov. 11, 2019

(65) Prior Publication Data
US 2021/0143031 A1  May 13, 2021

(51) Int. Cl.
*H01L 21/67* (2006.01)
*H01L 21/324* (2006.01)

(52) U.S. Cl.
CPC ...... *H01L 21/67109* (2013.01); *H01L 21/324* (2013.01); *H01L 21/67161* (2013.01); *H01L 21/67248* (2013.01)

(58) Field of Classification Search
CPC ......... H01L 21/67109; H01L 21/67098; H01L 21/67248; H01L 21/67161
See application file for complete search history.

(56) References Cited

U.S. PATENT DOCUMENTS

| | | | | |
|---|---|---|---|---|
| 5,884,009 A * | 3/1999 | Okase | ............... | H01L 21/67115 392/418 |
| 5,996,353 A * | 12/1999 | Maxwell | ............... | B01D 5/0042 62/259.2 |
| 6,402,509 B1 * | 6/2002 | Ookura | ............. | H01L 21/67248 219/405 |
| 6,855,916 B1 * | 2/2005 | Matthews | ........... | F27B 17/0025 118/50.1 |
| 10,186,429 B2 * | 1/2019 | Takenaga | .......... | H01L 21/67109 |
| 2002/0190052 A1 * | 12/2002 | Kitamura | .......... | H01L 21/67115 219/390 |
| 2003/0109071 A1 * | 6/2003 | Wang | .................... | H01L 21/324 438/14 |
| 2005/0201894 A1 * | 9/2005 | Suzuki | ............. | H01L 21/31662 427/255.28 |
| 2007/0095288 A1 * | 5/2007 | Saito | ................. | H01L 21/67109 118/725 |
| 2009/0191499 A1 * | 7/2009 | Surthi | ............... | H01L 21/67109 432/18 |
| 2015/0270125 A1 * | 9/2015 | Sasaki | ............... | H01L 21/02186 438/785 |

* cited by examiner

*Primary Examiner* — Mohsen Ahmadi
(74) *Attorney, Agent, or Firm* — ScienBiziP, P.C.

(57) ABSTRACT

A heat processing system is disclosed. The heat processing system includes an enclosure, a heater, and a plurality of valves disposed on the enclosure. The heater is used to increase temperature within the enclosure. The plurality of valves have different sizes to uniformly and efficiently control the cooling within the enclosure.

9 Claims, 3 Drawing Sheets

HEAT PROCESSING SYSTEM

BACKGROUND

1. Field

The present disclosure generally relates to heat processing system, and more particularly, heat processing system to generate uniform heat within enclosure.

2. Description of the Related Art

In order to manufacture a desired semiconductor unit, various thermal processes including an oxidation process, a diffusion process, a CVD process, an annealing process or the like are carried out to a substrate. As a thermal processing unit for conducting the processes, a heat processing system is used wherein a large number of wafers are thermally processed at a time.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
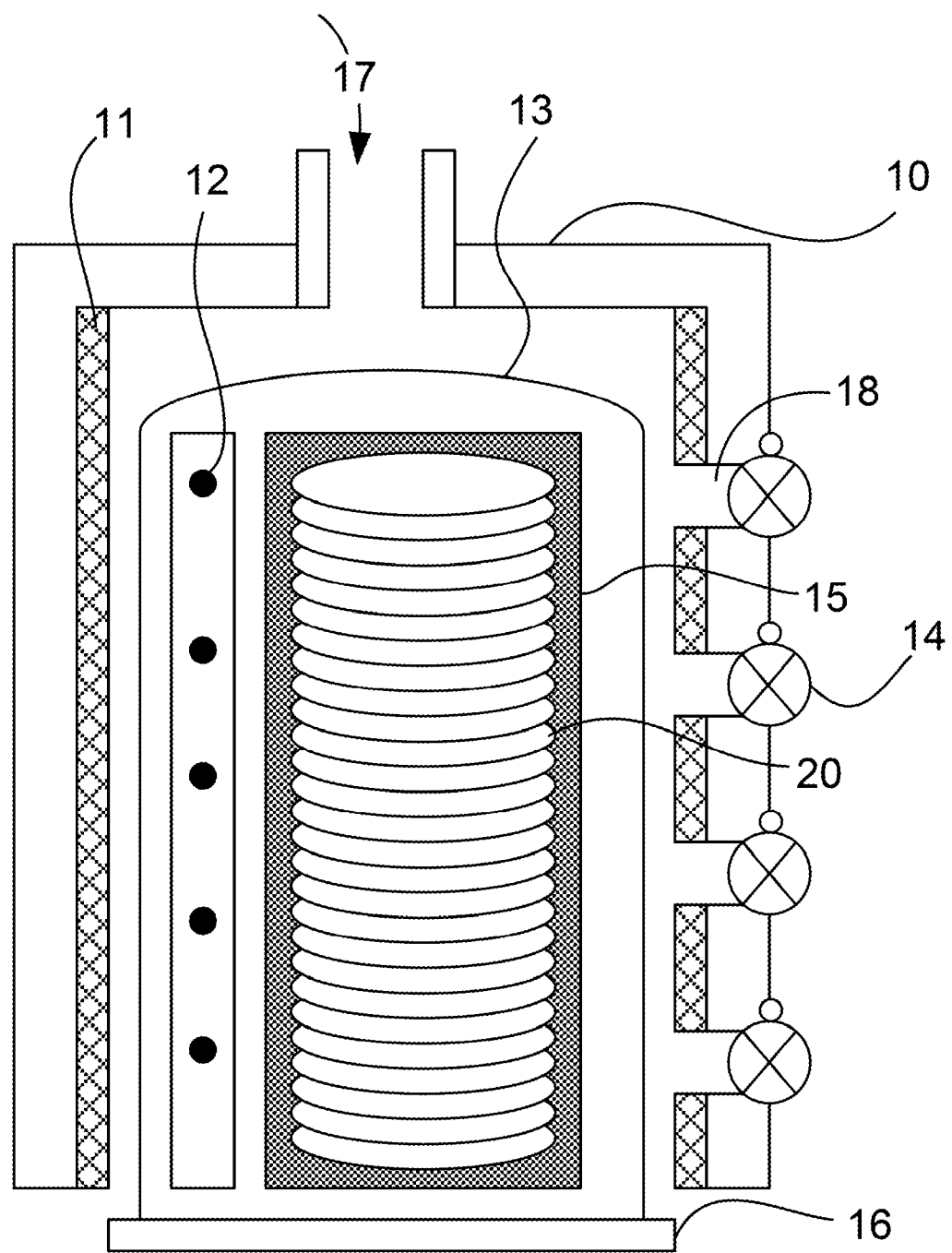
FIG. 1 illustrates a heat processing system according to some embodiments of the instant disclosure.

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 illustrates a heat processing system according to some embodiments of the instant disclosure. The heat processing system includes an enclosure, a plurality of valves 14, a heater 11, a process chamber 13, a temperature sensor 12, and a cap 16. The enclosure includes a surrounding wall 10. The surrounding wall 10 having an inlet 17 and a plurality of outlets 18. The plurality of outlets 18 have different diameters from each other. In some embodiments, the plurality of outlets 18 are holes formed on the surrounding wall 10. An outlet nearest to the inlet is a hole on the surrounding wall 10 that has a smallest diameter of the holes of the plurality of outlets 18. An outlet farthest from the inlet is a hole on the surrounding wall 10 that has a largest diameter of the holes of the plurality of outlets 18.

In some embodiments, the plurality of outlets 18 includes four holes, a first hole and a second hole of the four holes have a diameter of 10 mm. A third hole of the four holes have a diameter of 15 mm. A fourth hole of the four holes having a diameter of 20 mm.

In some embodiments, the plurality of outlets includes four holes, a first hole and a second hole of the four holes are configured to each exhaust about 25% of an air current within the surrounding wall 10. A third hole of the four holes is configured to exhaust about 20% of the air current within the surrounding wall 10. A fourth hole of the four holes is configured to exhaust about 30% of the air current within the surrounding wall 10.

In some embodiments, the plurality of valve 14 are disposed on an outer surface of the surrounding wall 10. Each of the plurality of valves 14 correspondingly coupled to the plurality of outlets 18. In some embodiments, the plurality of valves are triggered when pressure of an air current from the inlet is at least 10 kpa. In some embodiments, the plurality of valves are butterfly valves. In some embodiments, the plurality of valves are normally closed valves. In some embodiments, a valve 14 nearest to the to the inlet 17 has a smallest size of the plurality of valves 14 and a valve 14 farthest from the inlet 17 has a largest size of the plurality of valves 14.

The heater 11 is distributed over an inner surface of the surrounding wall 10. In some embodiments, the plurality of outlets 18 are further formed by holes on the heater 11 aligning to the holes formed on the surrounding wall 10. The process chamber 13 is disposed within the surrounding wall 10. The heater 11 is disposed between the surrounding wall 10 and the walls of the processing chamber 13 to further provide a layer of protection for the substrates 20 from direct heat generated by the heater 11. The temperature sensor 12 is disposed within the process chamber 13. There may be five temperature sensors 12 disposed within the process chamber 13. In some embodiments, the five temperature sensors 12 area equidistant from each other. That is, the distance between neighboring temperature sensors 12 are all the same. The cap 16 is configured to seal the process chamber 13. Furthermore, the cap 16 is configured to protect the plurality of substrates 20 being processed from outside environment.

The plurality of substrates 20 are disposed on a holder 15 to keep the substrates 20 in place. In some embodiments, the substrate 20 includes silicon. Alternatively, the substrate 20 may include germanium, silicon germanium, gallium arsenide or other appropriate semiconductor materials. In some embodiments, the shape of the substrates 20 is circular or quadrilateral, such as a square or a rectangle. Also alternatively, the substrate 20 may include at least one of an epitaxial layer, a silicon layer, and a silicon dioxide layer.

In some embodiments, the heat processing system further includes a plurality of pipes disposed between the plurality of outlets 18 and the plurality of valves 14 to correspondingly couple the plurality of outlets 18 to the plurality of valves 14.

Figure 2:
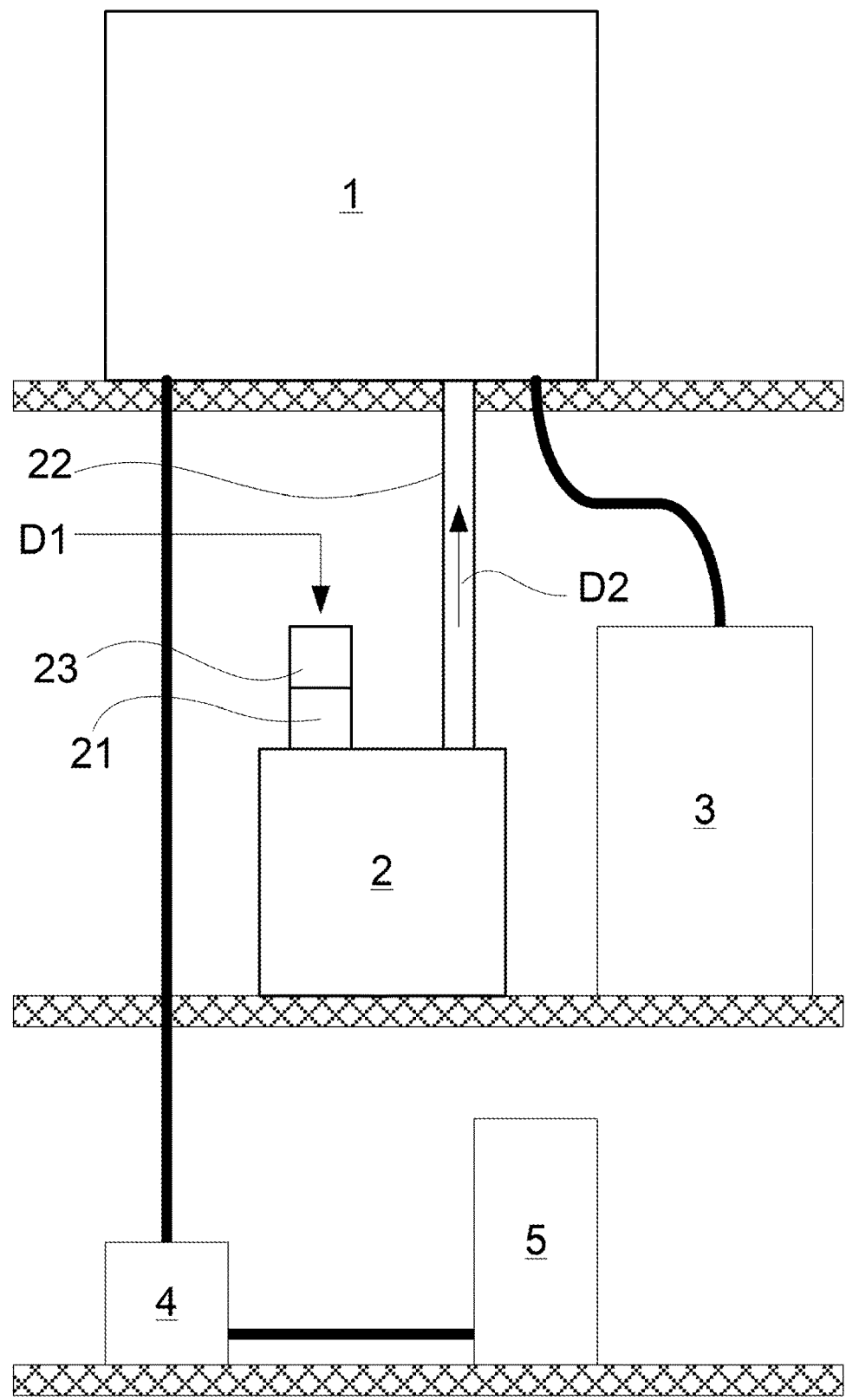
FIG. 2 illustrates a heat processing system according to some embodiments of the instant disclosure.

FIG. 2 illustrates a heat processing system according to some embodiments of the instant disclosure. The heat processing system includes a furnace 1. The furnace includes an enclosure, a plurality of valves, a heater, a process chamber, a temperature sensor, and a cap. In some embodiments, the heat processing system further includes a cooling unit 2 coupled to the inlet of the surrounding wall. The cooling unit 2 have an inlet 21 and an outlet 22. In some embodiments, the cooling unit 2 further includes a valve 23 disposed over the inlet 21 of the cooling unit 2 and an actuator coupled to the valve to control an opening of the valve 23. The arrow D1 shows a direction wherein air enters the cooling unit 2. The arrow D2 shows a direction wherein a cool gas from the cooling unit 2 is fed into the furnace 1. Since the cooling gas from the cooling unit 2 is evenly distributed within the furnace 1, the cooling time of the substrates being processed in the furnace 1 is reduced.

In some embodiments, the heat processing system further includes a power source 3 electrically coupled to the furnace 1. The power source 3 is configured to supply power to the furnace 1 to operate. In some embodiments, the heat processing system further includes a pump 4 coupled to the furnace 1 and a selective catalyst reduction (SCR) unit 5 coupled to the pump 4. In some embodiments, the pump 4 is used to extract unwanted exhaust from the furnace 1. In some embodiments, the SCR unit 5 is used to convert the unwanted exhaust from the furnace 1 to disposable waste material such as water and harmless gas.

Figure 3:
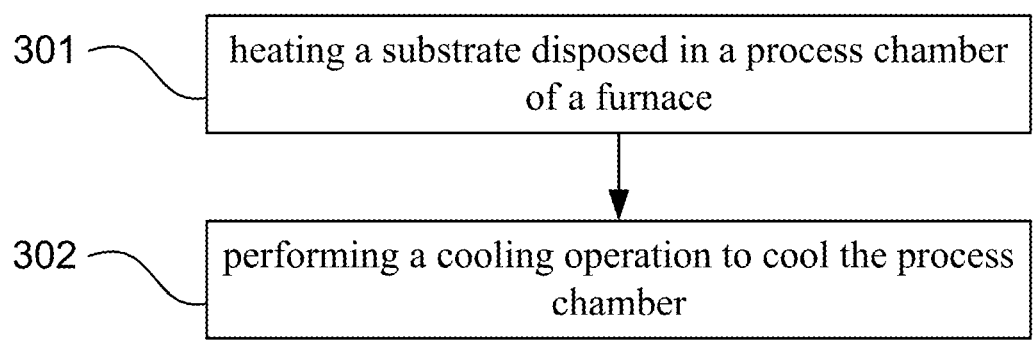
FIG. 3 illustrates a flowchart of a heat processing method according to some embodiments of the instant disclosure.

FIG. 3 illustrates a flowchart of a heat processing method according to some embodiments of the instant disclosure. In some embodiments, a heat processing system includes a furnace. The furnace includes an enclosure having a surrounding wall, a plurality of valves, a heater, a process chamber, a temperature sensor, and a cap. The heat processing method for semiconductor fabrication includes heating a substrate disposed in a process chamber of a furnace (301) and performing a cooling operation to cool the process chamber (302).

The process chamber is disposed within the surrounding wall. The temperature sensor is disposed within the process chamber. In some embodiments, there may be five temperature sensors disposed within the process chamber. Furthermore, there may be a plurality of substrates disposed within the process chamber. The plurality of substrates are disposed on a holder to keep the substrates in place. In some embodiments, the substrate includes silicon. Alternatively, the substrate may include germanium, silicon germanium, gallium arsenide or other appropriate semiconductor materials. In some embodiments, the shape of the substrates is circular or quadrilateral, such as a square or a rectangle. Also alternatively, the substrate may include at least one of an epitaxial layer, a silicon layer, and a silicon dioxide layer. The cap is configured to seal the process chamber. The cap is configured to protect the plurality of substrates being processed from outside environment.

During the heating of the substrate, the substrate is heated using a heater distributed over an inner surface of a surrounding wall of the furnace. The heater is disposed between the surrounding wall of the enclosure and the walls of the processing chamber to further provide a layer of protection for the substrates from direct heat.

During a cooling operation, an air current is introduced around the process chamber through an inlet of the surrounding wall and exhausted through a plurality of valves disposed on an outer surface of the surrounding wall. The air current may be a cooling gas that has a temperature lower than the ambient air temperature within the furnace. In some embodiments, the temperature of the cooling gas may be the same as or lower than the target ambient temperature for the process chamber of the furnace.

Each of the plurality of valves is respectively coupled to one of a plurality of outlets arranged in the surrounding wall. The plurality of outlets have different diameter from each other. In some embodiments, the plurality of outlets includes four holes. a first hole and a second hole of the four holes have a diameter of 10 mm. A third hole of the four holes have a diameter of 15 mm. A fourth hole of the four holes having a diameter of 20 mm.

In some embodiments, the plurality of outlets includes four holes, a first hole and a second hole of the four holes are configured to each exhaust about 25% of an air current within the surrounding wall. A third hole of the four holes is configured to exhaust about 20% of the air current within the surrounding wall. A fourth hole of the four holes is configured to exhaust about 30% of the air current within the surrounding wall.

In some embodiments, each of the plurality of valves correspondingly coupled to the plurality of outlets. In some embodiments, the plurality of valves are triggered when pressure of an air current from the inlet is at least 10 kpa. In some embodiments, the plurality of valves are butterfly valves. In some embodiments, the plurality of valves are normally closed valves. In some embodiments, a valve nearest to the to the inlet has a smallest size of the plurality of valves and a valve farthest from the inlet has a largest size of the plurality of valves.

In some embodiments, the furnace further includes a plurality of pipes disposed between the plurality of outlets and the plurality of valves to correspondingly couple the plurality of outlets to the plurality of valves.

In some embodiments, the heat processing system further includes a cooling unit coupled to the inlet of the surrounding wall to provide the air current. The cooling unit have an inlet and an outlet. In some embodiments, the cooling unit further includes a valve disposed over the inlet of the cooling unit and an actuator coupled to the valve to control an opening of the valve. The air enters the inlet the cooling unit. A cool gas from the outlet of the cooling unit is fed into the furnace. Since the cooling gas from the cooling unit is evenly distributed within the furnace, the cooling time of the substrates being processed in the furnace is reduced.

In some embodiments, the heat processing system further includes a power source electrically coupled to the furnace. The power source is configured to supply power to the furnace to operate. In some embodiments, the heat processing system further includes a pump coupled to the furnace and a selective catalyst reduction (SCR) unit coupled to the pump. In some embodiments, the pump is used to extract unwanted exhaust from the furnace. In some embodiments, the SCR unit is used to convert the unwanted exhaust from the furnace to disposable waste material such as water and harmless gas.

Accordingly, one aspect of the instant disclosure provides a heat processing system that comprises an enclosure comprising a surrounding wall having an inlet and a plurality of outlets, the plurality of outlets having different diameter from each other; a plurality of valves disposed on an outer surface of the surrounding wall, each of the plurality of valves correspondingly coupled to the plurality of outlets; a heater distributed over an inner surface of the surrounding wall; a process chamber disposed within the surrounding wall; a temperature sensor disposed within the process chamber; and a cap configured to seal the process chamber.

In some embodiments, the system further comprises a cooling unit coupled to the inlet of the surrounding wall, the cooling unit having an inlet and an outlet.

In some embodiments, the cooling unit further comprising a valve disposed over the inlet of the cooling unit and an actuator coupled to the valve to control an opening of the valve.

In some embodiments, the plurality of outlets are holes formed on the surrounding wall, a hole nearest to the inlet having a smallest diameter of the holes and a hole farthest from the inlet having a largest diameter of the holes.

In some embodiments, the plurality of outlets includes four holes, a first hole and a second hole of the four holes having a diameter of 10 mm, a third hole of the four holes having a diameter of 15 mm, and a fourth hole of the four holes having a diameter of 20 mm.

In some embodiments, the plurality of outlets includes four holes, a first hole and a second hole of the four holes are configured to each exhaust about 25% of an air current within the surrounding wall, a third hole of the four holes is configured to exhaust about 20% of the air current within the surrounding wall, and a fourth hole of the four holes is configured to exhaust about 30% of the air current within the surrounding wall.

In some embodiments, the plurality of valves are triggered when pressure of an air current from the inlet is at least 10 kpa.

In some embodiments, the plurality of valves are butterfly valves.

In some embodiments, the plurality of valves are normally closed valves.

In some embodiments, the system further comprises a plurality of pipes disposed between the plurality of outlets and the plurality of valves to correspondingly couple the plurality of outlets to the plurality of valves.

In some embodiments, a valve of the plurality of valves nearest to the to the inlet has a smallest size of the plurality of valves and a valve of the plurality of valves farthest from the inlet has a largest size of the plurality of valves.

Accordingly, another aspect of the instant disclosure provides a heat processing method for semiconductor fabrication that comprises heating a substrate disposed in a process chamber of a furnace, in which the substrate is heated using a heater distributed over an inner surface of a surrounding wall of the furnace; and performing a cooling operation to cool the process chamber, in which an air current is introduced around the process chamber through an inlet of the surrounding wall and exhausted through a plurality of valves disposed on an outer surface of the surrounding wall, each of the plurality of valves being respectively coupled to one of a plurality of outlets arranged in the surrounding wall, the plurality of outlets having different diameter from each other.

In some embodiments, the air current for the cooling operation is supplied by a cooling unit coupled to the inlet of the surrounding wall, the cooling unit having an inlet and an outlet.

In some embodiments, the cooling unit further comprising a valve disposed over the inlet of the cooling unit and an actuator coupled to the valve to control an opening of the valve.

In some embodiments, the plurality of outlets are holes formed on the surrounding wall, a hole nearest to the inlet having a smallest diameter of the holes and a hole farthest from the inlet having a largest diameter of the holes.

In some embodiments, the plurality of outlets includes four holes, a first hole and a second hole of the four holes having a diameter of 10 mm, a third hole of the four holes having a diameter of 15 mm, and a fourth hole of the four holes having a diameter of 20 mm.

In some embodiments, the plurality of outlets includes four holes, a first hole and a second hole of the four holes each exhaust 25% of the air current, a third hole of the four holes exhaust 20% of the air current, and a fourth hole of the four holes exhaust 30% of the air current.

In some embodiments, the method further comprises triggering the plurality of valves when pressure of an air current from the inlet is at least 10 kpa and the plurality of valves are normally closed valves.

In some embodiments, the plurality of valves are butterfly valves.

In some embodiments, a valve of the plurality of valves nearest to the to the inlet has a smallest size of the plurality of valves and a valve of the plurality of valves farthest from the inlet has a largest size of the plurality of valves.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A heat processing system, comprising:
   an enclosure comprising a surrounding wall having an inlet and a plurality of outlets, the plurality of outlets having different diameter from each other;
   a plurality of valves disposed on an outer surface of the surrounding wall, each of the plurality of valves correspondingly coupled to the plurality of outlets;
   a heater distributed over an inner surface of the surrounding wall;
   a process chamber disposed within the surrounding wall;
   a temperature sensor disposed within the process chamber;
   a cap configured to seal the process chamber; and
   a cooling unit coupled to the inlet of the surrounding wall, the cooling unit having an inlet and an outlet, wherein the cooling unit further comprising a valve disposed over the inlet of the cooling unit and an actuator coupled to the valve to control an opening of the valve.

2. The heat processing system of claim 1, wherein the plurality of outlets are holes formed on the surrounding wall, a hole nearest to the inlet having a smallest diameter of the holes and a hole farthest from the inlet having a largest diameter of the holes.

3. The heat processing system of claim 1, wherein the plurality of outlets includes four holes, a first hole and a second hole of the four holes having a diameter of 10 mm, a third hole of the four holes having a diameter of 15 mm, and a fourth hole of the four holes having a diameter of 20 mm.

4. The heat processing system of claim 1, wherein the plurality of outlets includes four holes, a first hole and a second hole of the four holes are configured to each exhaust about 25% of an air current within the surrounding wall, a third hole of the four holes is configured to exhaust about 20% of the air current within the surrounding wall, and a fourth hole of the four holes is configured to exhaust about 30% of the air current within the surrounding wall.

5. The heat processing system of claim 1, wherein the plurality of valves are triggered when pressure of an air current from the inlet is at least 10 Kpa.

6. The heat processing system of claim 1, wherein the plurality of valves are butterfly valves.

7. The heat processing system of claim 1, wherein the plurality of valves are normally closed valves.

8. The heat processing system of claim 1, further comprising a plurality of pipes disposed between the plurality of outlets and the plurality of valves to correspondingly couple the plurality of outlets to the plurality of valves.

9. The heat processing system of claim 1, wherein a valve of the plurality of valves nearest to the to the inlet has a smallest size of the plurality of valves and a valve of the plurality of valves farthest from the inlet has a largest size of the plurality of valves.

\* \* \* \* \*